United States Patent [19]
Sanwo et al.

[11] Patent Number: 5,903,167
[45] Date of Patent: May 11, 1999

[54] HIGH SPEED CMOS BUS TRANSMITTER AND RECEIVER

[75] Inventors: Ikuo Jimmy Sanwo, San Marcos; Paul Georgief, San Diego, both of Calif.

[73] Assignees: Sony Corporation, Tokyo, Japan; Sony Electronics, Inc., Park Ridge, N.J.

[21] Appl. No.: 08/812,961

[22] Filed: Mar. 5, 1997

[51] Int. Cl.$^6$ .............................................. H03K 19/0185
[52] U.S. Cl. ............................................. 326/86; 326/83
[58] Field of Search ................................ 326/30, 68, 73, 326/83, 86

[56] References Cited

U.S. PATENT DOCUMENTS

| | | | |
|---|---|---|---|
| 4,103,188 | 7/1978 | Morton | 326/84 |
| 5,019,728 | 5/1991 | Sanwo et al. | 326/86 |
| 5,023,488 | 6/1991 | Gunning | 307/475 |
| 5,438,281 | 8/1995 | Takahashi et al. | 326/86 |
| 5,463,331 | 10/1995 | Kuo | 326/86 |
| 5,570,044 | 10/1996 | Martin et al. | 326/86 |
| 5,594,370 | 1/1997 | Nguyen et al. | 326/86 |
| 5,699,541 | 12/1997 | Kurosawa et al. | 395/405 |

OTHER PUBLICATIONS

Thomas F. Knight, Jr. and Alexander Krymm; "A Self–Terminating Low–Voltage Swing CMOS Output Driver"; *The Journal of Solid–State Circuits*, vol. 23, No. 2, Apr. 1988, pp. 457–464.

*Primary Examiner*—Jon Santamauro
*Assistant Examiner*—Don Phu Le
*Attorney, Agent, or Firm*—Blakely, Sokoloff, Taylor & Zafman LLP

[57] ABSTRACT

A circuit, system, and method for increasing the speed of a bus by reducing the capacitive loading effect of transistors coupled to the bus are provided. The transistors, which are sub-micrometer channel length CMOS transistors, make up a tranceiver comprised of a transmitter and a reciever. The transistors that make up the transciever are coupled to the bus through a pair of Schottky diodes in series. The diode pair is coupled to isolate the bus from the junction capacitance of the transistors. The bus is a multi-segment transmission line with a characteristic impedance. The opposite ends of the transmission line are terminated with the characteristic impedance of the transmission line. The voltage swing of the bus is limited to approximately 1 volt. The pair of Schottky diodes isolate the signal bus line from the capacitive loading effects of the transistor drivers used to drive the voltages on the transmitting end of the bus, especially when the bus is being pulled to a logic high level. This results in minimal loading of the bus line and allows for a faster transmission rate. Speed is also increased by having only approximately a 1 volt swing of the bus line between logic high and logic low voltage states. All devices for this circuit can be fabricated using a standard metal-oxide-semiconductor fabrication process.

8 Claims, 3 Drawing Sheets

HIGH SPEED CMOS BUS TRANSMITTER AND RECEIVER

FIELD OF THE INVENTION

The invention relates to the field of computer data transfer systems. In particular, the invention relates to a method for increasing the data transfer speed of data buses suitable for use with microprocessor chips.

BACKGROUND OF THE INVENTION

Digital computers and the like often include a plurality of very large scale integration (VLSI) circuits which are interconnected for binary communications by a bus or a transmission line. Transmitters and receivers interface the VLSI components of such systems to the transmission lines. The transmission lines may have their opposite ends terminated at their characteristic impedance. This results in the power internally dissipated by the driver being proportional to the nominal voltage swing of the binary signal it applies to the transmission line.

Complementary metal-oxide-semiconductor (CMOS) technology digital circuits are attractive for use in digital computers because of lower power consumption and hence lower cooling requirements, and lower construction cost. However, CMOS chips are inferior to emitter-coupled logic (ECL) components in both intra-chip and inter-chip operation speeds. The aforementioned advantages of ECL chips are mainly due to a lower voltage swing between logic low and logic high levels, and fewer transmission line effects resulting from impedance matching. The rail-to-rail voltage swing of standard CMOS circuits tends to cause the transmitters of such circuits to dissipate excessive amounts of power internally whenever the transmitters are working into low impedance loads such as terminated transmission lines.

The trend to faster CMOS technologies allows the design of very fast on-chip logic gates. This high performance often ends, however, at the die pads where typical modern digital CMOS devices drive their output pads with a simple CMOS inverter. The inverter, which swings the output pad from ground to rail voltage, is large in order to drive its capacitive output load quickly. The large output inverter is itself driven by a string of scaled inverters, typically three stages, to scale the internal on-chip gate signals to a drive level capable of quickly switching the large external capacitance.

This approach was very successful for the 3–4 micrometer channel-length CMOS generations, because the rise time of the final output inverter was limited to a 5–10-nanosecond transition time. Since this transition time was relatively slow, the traces on a typical printed circuit board could be successfully modeled as lumped capacitive loads. However, the disparity between on-chip processing speeds and inter-chip communication speed becomes increasingly troublesome as CMOS technology scales into the sub-micrometer channel length region. This is because modern CMOS technology, with sub-micrometer channel lengths, results in output switching times in the sub-nanosecond range. Printed circuit traces can no longer be treated as purely capacitive loads when driven by sub-nanosecond rise-time signals. The large junction capacitance associated with CMOS circuits thus limits the speed of the bus by loading down the bus line. Prior art designers have approached this problem by explicitly slowing the turn-on of output transistors. While this slows the rise time of the signal and allows the load to be treated as purely capacitive, it also slows the arrival of the output signal at its destination.

Designers of prior art circuits also attempted to solve this signaling problem with the use of terminated transmission lines as an interconnection technique. Terminated transmission lines have many advantages over driving capacitive loads. However, sizing the final output driver stage sufficiently large to allow driving a terminated transmission line is problematic because it requires large and slow predriver stages which dissipate large amounts of power. Designers of prior art circuits reduce this power dissipation problem by utilizing a low voltage logic swing transmitter and receiver. However, there remains a need to reduce capacitive loading effects of the transistor drivers used to drive the voltages on the transmitting end of the bus in order to increase the data transfer speed of data buses used with CMOS chips.

SUMMARY OF THE INVENTION

A method and apparatus for increasing the bus speed by reducing the capacitive loading effect of CMOS transistor drivers are provided. According to one aspect of the invention, a circuit is provided for reducing the capacitive loading effect of CMOS transistors. The circuit generally includes a high speed bus transceiver comprised of a receiver coupled to a bus, and a transmitter coupled to the receiver and the bus. The transmitter includes at least one transistor and at least one diode. The diode is coupled to isolate the bus from the junction capacitance of the transistor.

According to another aspect of the invention, a method is provided for reducing the capacitive loading effect of CMOS transistor drivers. According to this method, a bus is coupled to the transmitter portion of a transceiver using at least one diode. In the transmit mode, the at least one diode of the transmitter is reverse biased so as to isolate the bus from the junction capacitance of the transmitter's at least one transistor. The bus is a transmission line having opposite ends terminated with the characteristic impedance of the bus. The voltage swing of the bus is limited.

These and other features, aspects, and advantages of the present invention will be apparent from the accompanying drawings and from the detailed description and appended claims which follow.

BRIEF DESCRIPTION OF THE DRAWINGS

The present invention is illustrated by way of example and not limitation in the figures of the accompanying drawings, in which like references indicate similar elements and in which.

DETAILED DESCRIPTION

A method and an apparatus for increasing the data transfer speed of data buses in microprocessor chips are provided. In the following description, for purposes of explanation, numerous specific details are set forth in order to provide a thorough understanding of the present invention. It will be evident, however, to one skilled in the art that the present invention may be practiced without these specific details. In other instances, well-known structures and devices are shown in block diagram form in order to avoid unnecessarily obscuring the present invention.

Figure 1:
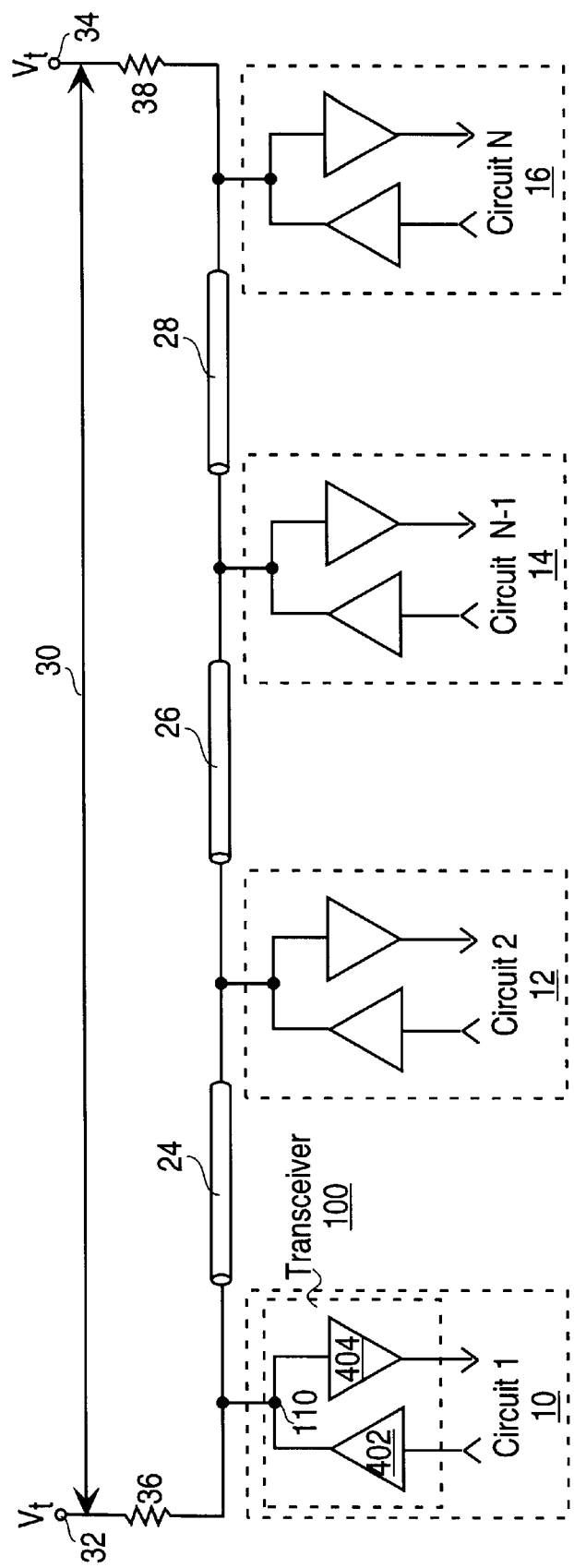
FIG. 1 illustrates a simplified schematic diagram of an embodiment of a set of VLSI CMOS circuits which are interfaced to a transmission line.
Figure 2:
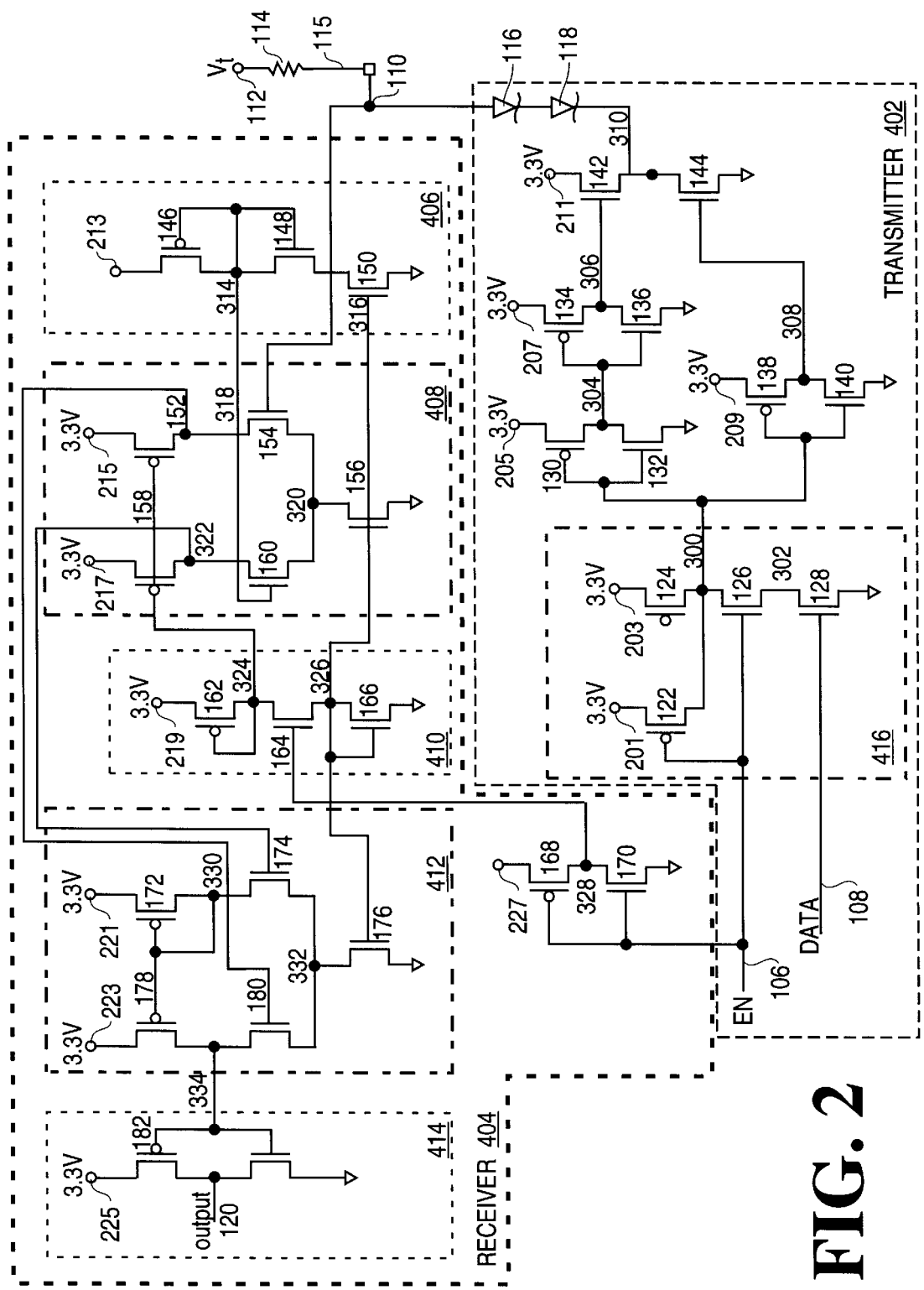
FIG. 2 illustrates a detailed schematic diagram of an embodiment of a high speed CMOS bus transceiver.

FIGS. 1 and 2 show one embodiment for a high speed chip data transfer system implemented using CMOS technology and having a data transfer bus or transmission line 30 that transfers data in the form of logic high and logic low voltages. In the figure, all transistors are of the metal oxide semiconductor field-effect type (MOSFET), with a bubble at the gate indicating a p-channel device, and the absence of a bubble at the gate indicating an n-channel device. It is readily apparent that the circuitry described herein is not limited to MOSFET devices. Furthermore, all values recited herein are approximated; it is contemplated that values in the range about the value recited are applicable.

FIG. 1 illustrates a simplified schematic diagram of an embodiment of a set of very large scale integration (VLSI) complementary metal-oxide-semiconductor (CMOS) circuits 10, 12, 14, and 16 capable of transmitting and receiving data signals. There are a plurality of VLSI CMOS circuits 10, 12, 14, and 16 (shown only in relevant part), which are interfaced to a transmission line 30 for minor communications. The number of transceivers 100 included in the system is a matter of design choice. In the present embodiment, the circuits 10–16 are functionally interrelated members of a chip set for a digital computer (not shown). Accordingly, in practice, the transmission line 30 may be one of several generally similar conductive traces which are formed on a suitable substrate to form an N-bit wide bus where N is determined by the computer architecture. Furthermore, the circuits 10–16 described herein are not limited in application to the digital computer interfaces; circuits 10–16 are applicable in use to any high speed interface.

The interfaces between circuits 10–16 and the transmission line 30 may take various forms in an environment of the foregoing type. Some interfaces may be configured to function as transceivers 100 so they have a transmitter 402 and a receiver 404 which are coupled to the transmission line 30 via a shared or common node 110 (see the interface shown for circuit 10); others may have merely a transmitter for transmit only mode of operations (not shown), and still others may have merely a receiver for receive mode only of operation (not shown).

The transmission line 30 of the present embodiment is made up of a plurality of segments 24, 26, and 28. The opposite ends of the transmission line 30 are tied to a reference voltage source at nodes 32 and 34. Opposite ends of the transmission line are terminated at their characteristic impedance 36 and 38. In the present embodiment, the transmission line has a characteristic impedance Zo of 75 Ohms; thus resistors 36 and 38 each are 75 Ohm resistors. By terminating the transceivers 100 in the transmission line characteristic impedance, data signal reflection and ringing are eliminated. The impedance matching of transceivers 100 also increases the data transfer speeds.

The resistors 36 and 38 are each connected to a terminal 32 and 34, respectively. In the present embodiment, the terminals 32 and 34 are connected to a 2 volt voltage source. The voltage source at terminals 32 and 34 acts as a transmission line 30 pre-charger to pre-charge the transmission line 30 to 2 volts. The logic levels on the transmission line 30 in the present embodiment are 2 volts for a logic high signal and 1 volt for a logic low signal. The embodiment operates using low voltage swings. Therefore, the circuit experiences enhanced faster transmission line transition times between the two logic states.

In the present embodiment each of the transceivers 100 of the circuits 10–16 include a transmitter 402 and a receiver 404. The voltage sources internal to the transceivers are at the CMOS levels, i.e. 3.3 volts representing the logic high level, and 0 volts representing the logic low level. Each of the transmitters 402 of circuits 10–16 include at least one sub-micrometer channel length CMOS transistor for transmitting binary signals to the transmission line 30 from a conventional CMOS signal source and for effectively isolating the transmission line 30 from the ordinary rail-to-rail voltage swing of the signal source.

Figure 3:
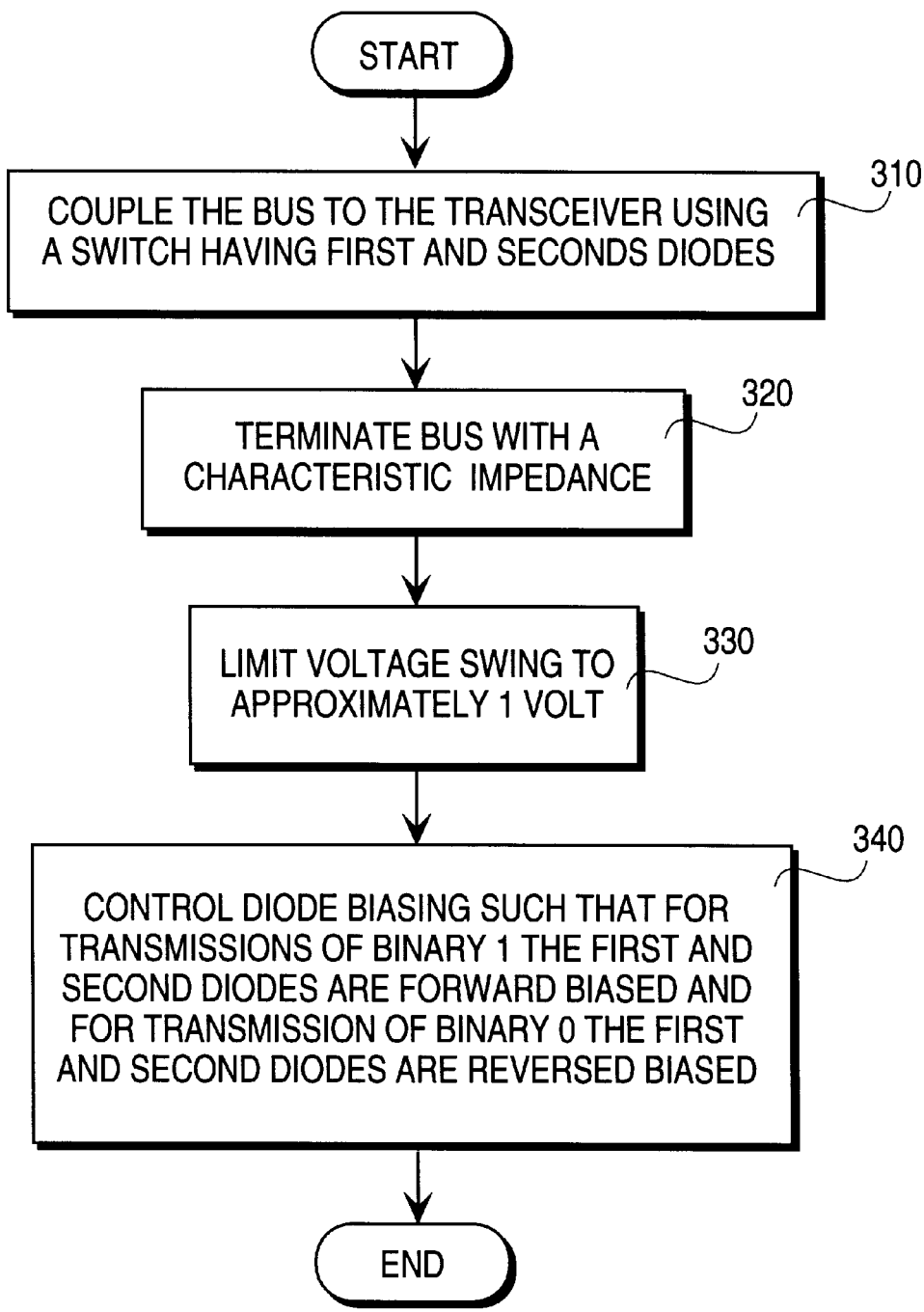
FIG. 3 is a simplified flow diagram that generally describes one embodiment of the method employed in the bus transceiver of the present invention.

The method performed is generally described with reference to FIG. 3. At step 310, the transceiver is coupled to bus using a switch that includes at least two diodes. At step 320, the bus is terminated according to its characteristic impedance. The voltage swing is limited to approximately one volt, step 330. At step 340, biasing is controlled such that for transmission of a binary 1, the diodes are forward biased and for transmission of a binary 0, the diodes are reversed biased.

FIG. 2 illustrates a detailed schematic diagram of an embodiment of a high speed CMOS bus transceiver 100. The embodiment shown in FIG. 2 is a high speed bus transceiver 100 comprising a receiver 404 coupled to a bus 115 and a transmitter 402 coupled to the receiver 404 and the bus 115. The transmitter 402 and the receiver 404 are coupled to the bus 115 at a common node 110. The bus 115 is terminated in the characteristic impedance 114 of the bus 115 and is tied to a voltage source at node 112. In the present embodiment the bus 115 is a transmission line having a characteristic impedance Zo of approximately 75 Ohms. The bus 115 transfers data in the form of signals having a high and a low logic level, with the logic levels approximately equal to 2 volts and 1 volt, respectfully.

With reference to FIG. 2, transistors 122-144 and diodes 116 and 118 constitute the transmitter 402 portion of the circuit. Within the transmitter 402, transistors 122–128 comprise a two input NAND gate 416 which controls whether the transceiver is in a transmit state and also the transmit signal level. The enable line 106, one of the two inputs of the NAND gate 416, must be a logic high (3.3 volts) signal in order for the transmitter 402 portion of the circuit to be operative. The other input of the NAND gate 416, data line 108, controls the signal level transmitted.

Transistors 142 and 144 along with Schottky diodes 116 and 118 comprise the main switching portion of the transmitter. Node 300 is the output of the NAND gate 416 with node 306 acting as a buffered voltage of node 300, and with node 308 being the complement of node 306. Since nodes 306 and 308 are complements, only one transistor 142 or 144 is on at any given signal level. In one embodiment of the present invention, pullup transistor 142 is a small and pulldown transistor 144 is a large n-channel metal-oxide semiconductor (NMOS) device used to quickly pull the bus line 115 either high or low at node 110 depending on the transmission bit being sent. The large junction capacitance associated with standard CMOS bus designs contributes considerably to the speed limitations of the bus 115 by loading down the bus 115. This invention remedies this problem by isolating the bus 115 from the effects of this large junction capacitance by using two Schottky diodes 116 and 118. When the diodes 116 and 118 are reversed biased, the bus line 115 is isolated from the effects of the large capacitance from the large transistors and the bus 115 only senses the small junction capacitance associated with diode 116 in series with diode 118. This minimizes the loading of the bus 115 and drastically improves bus speed. In order to improve gain without requiring any additional power supply lines the voltage swing of the bus 115 at node 110 is kept at 1 volt with bus voltage varying between 1 volt and 2 volts. This small voltage swing also allows for quicker switching.

In operation, the transmitter 402 has two transmission states corresponding to transmitting a logic 1 and a logic 0 transmission bit. When a logic 1 transmission bit is being sent by the transmitter 402, the enable line 106 is in a logic high state (3.3 volts), and the data line 108 is also in a logic high state (3.3 volts). This results in transistors 126, 128, 130, 136, 138, and 144 being on, and transistors 122, 124, 132, 134, 140 and 142 being off. Transistor 142 being off and transistor 144 being on causes the Schottky diodes 116 and 118 to be forward biased, resulting in a voltage drop at the output node 110. The voltage drop at node 110 is 1 volt, a result of the voltage drop through the two diodes 116 and 118 of 0.4 volts each (total drop of 0.8 volts) and also to the drain to source voltage drop of transistor 144 (0.2 volts). This results in the voltage at node 110 being 1 volt.

When a logic 0 transmission bit is being sent by the transmitter 402 the enable line 106 is in a logic high state (3.3 volts), and the data line 108 is in a logic low state (0 volts). This results in transistors 124, 126, 132, 134, 140, and 142 being on, and transistors 122, 128, 130, 136, 138, and 144 being off. When transistor 142 is on and transistor 144 is off, node 310 is driven by transistor 142 to a voltage of approximately 2.3 volts. This is smaller than the rail voltage of 3.3 volts due to the body effect and the drain to source drop which lowers the output voltage at node 310. However, this voltage of 2.3 volts is sufficient to reverse bias the Schottky diodes 116 and 118, resulting in the output node 110 being completely isolated from the effects of a large junction capacitance that is present due to transistor 144. Thus, if the circuit is in transmit mode the output voltage 110 will be pulled to 2 volts by the power supply.

As previously stated, the transmitter 402 is only operative when the enable line 106 is in a logic high state (3.3 volts). When the enable line 106 is in a logic low state (0 volts), the output voltage at node 110 is effectively isolated from the transmitter 402. The transceiver 100 is in the receive mode.

The receiver 404 portion of the transceiver 100 consist of transistors 146–184. The receiver 404 includes two voltage bias networks 406 and 410, two differential amplifiers 408 and 412, and an output inverter 414. The first differential amplifier 408 includes transistors 152–160 and is a double ended input/double ended output differential amplifier. The output from the first differential amplifier 408 is fed into the input of a second differential amplifier 412 comprised of transistors 172–180. This second differential amplifier 412 is a standard double ended input/single ended output differential amplifier. The output of the second differential amplifier 412, node 334, is fed into an inverter 414 which inverts the signal and buffers the output producing the output of the receiver at node 120 which is either a logic high (3.3 volts) or a logic low (0 volts) level.

In operation, when the enable line 106 is high (3.3 volts), indicating that the transceiver 100 is in the transmission mode, transistor 164 is turned off along with transistors 146, 150, 152, 156, 158, 162, 166, 172, 176 and 178.

With transistor 164 off, the first voltage bias network 408 transistors 146–150 and the second voltage bias network 410 transistors 162–166 are turned off. This effectively shuts down the current bias transistors 156 and 176 of both differential amplifier circuits 408 and 412 and helps to reduce power dissipation when the receiver is not in use.

When the enable line 106 is low (0 volts) indicating that the transceiver 100 is in the receive mode, transistor 164 is turned on. With transistor 164 on, bias voltages are set up at nodes 322, 324, and 314. The first bias network 406 consists of transistors 146–150 and provides the node 314 bias voltage. This provides the bias voltage that will be used by the first differential amplifier 408 as a reference to which the bus voltage is compared in order to determine the binary state of the bus signal. It can simply be considered as an inverter with the inverter input tied to the output 120. The size of transistor 150 can be controlled to further reduce or increase the bias voltage value to any value between the swing voltages of 1 volt and 2 volts.

The second bias voltage network 410 consist of transistors 162–166 and provides bias voltages at nodes 324 and 326. This combination of transistors can also be effectively treated as an inverter with the input tied to the output. The output from each of nodes 324 and 326 is approximately 1.6 volts which is approximately half the supply voltage of 3.3 volts. The outputs from the first differential amplifier 408 (nodes 318 and 322) are sent into a second signal output differential amplifier 412 comprised of transistors 172–180. This provides for better gain and discrimination between the logic low and logic high states of the bus 115.

In operation the preferred embodiment of the receiver 404 has two states corresponding to the bus voltage present on the bus 115, node 110. One state corresponds to receiving a logic low signal from the bus, logic low having a bus voltage value of 1 volt. The other state corresponds to receiving a logic high signal from the bus 115, logic high having a bus voltage value of 2 volts. When the signal at the enable line 106 is logic low which indicates that the transceiver 100 is in the receive mode and a logic low signal is on the bus 115 then transistors 146, 148, 150, 156, 158, 162, 164, 166, 172, 176, 178, and 184 are all turned on while transistor 184 is off. The resulting voltages at nodes 110, 322, 334 are all logic low. The resulting voltages at nodes 314, 318, and 330 are all logic high. When the receiver 404 is enabled and a logic high signal is present on the bus 115 then transistors 146, 148, 150, 156, 158, 162, 164, 166, 172, 176, 178, and 182 are all turned on while transistor 182 is off. The resulting voltage at nodes 314, 318, and 330 is logic low. The resulting voltage at nodes 110, 322, and 334 is logic high.

Thus, a method and apparatus for increasing the data transfer speed of data buses in microprocessor chips have been provided. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A high speed transceiver for coupling a component to a transmission line, the transceiver comprising:

a receiver comprising,
 a first voltage bias circuit coupled to receive a signal from the transmission line through a common node;
 a first differential amplifier coupled to receive the signal from the first voltage bias circuit;
 a second voltage bias circuit coupled to receive the signal from the first differential amplifier,
 a second differential amplifier coupled to receive the signal from the second voltage bias circuit; and
 an output circuit coupled to receive the signal from the second differential amplifier and to output the signal to the component;

a transmitter comprising,
 a NAND circuit coupled to receive an enable signal and a signal to be transmitted, wherein if the enable signal is active, the signal to be transmitted is transmitted to the transmission line through the common node; and at least one diode coupled to isolate the transmission line from a junction capacitance of the transceiver.

2. The high speed transceiver of claim 1, wherein the signal and signal to be transmitted are each voltages compatible with complementary metal-oxide-semiconductor (CMOS) technology, and wherein the voltages represent a logic one or a logic zero.

3. The high speed transceiver of claim 2, wherein a logic one is represented by a voltage of approximately 3.3 volts and wherein a logic zero is represented by a voltage of approximately zero volts.

4. The high speed transceiver of claim 3, wherein the transmission line is terminated in a characteristic impedance of the transmission line.

5. The high speed transceiver of claim 4, wherein the transmitter further comprises a switch coupled to the transmission line through the common node, the switch comprising a first transistor; a second transistor, a first diode and a second diode.

6. The high speed transceiver of claim 5, wherein the second diode is coupled to a source of the first transistor and to a drain of the second transistor.

7. The high speed transceiver of claim 6, wherein at least one of the first and second transistors is a relatively large n-channel metal-oxide semiconductor (NMOS) device.

8. In a computer system including a high speed bus, a method for reducing a load on the bus that occurs when data is transmitted between the bus and a component through a transceiver, the method comprising the steps of:

coupling the transceiver to the bus through at least one diode;

terminating the bus with an impedance that is a characteristic impedance of the bus;

limiting a voltage swing of the bus to approximately one volt;

controlling a bias of the at least one diode so that when a signal representing a logic zero is to be transmitted, the at least one diode is reverse biased; and performing a logic NAND operation on an enable signal and a data signal entering the transceiver so that when the enable signal is active, the data signal is transmitted to the bus.

* * * * *